US012803521B2

(12) United States Patent
Goto et al.

(10) Patent No.: US 12,803,521 B2
(45) Date of Patent: Nov. 17, 2026

(54) PACKAGED ACOUSTIC WAVE DEVICES WITH MULTILAYER PIEZOELECTRIC SUBSTRATE

(71) Applicant: Skyworks Solutions, Inc., Irvine, CA (US)

(72) Inventors: Rei Goto, Osaka (JP); Hironori Fukuhara, Ibaraki (JP)

(73) Assignee: Skyworks Solutions, Inc., Irvine, CA (US)

( * ) Notice: Subject to any disclaimer, the term of this patent is extended or adjusted under 35 U.S.C. 154(b) by 144 days.

(21) Appl. No.: 18/673,830

(22) Filed: May 24, 2024

(65) Prior Publication Data

US 2024/0396519 A1 Nov. 28, 2024

Related U.S. Application Data

(60) Provisional application No. 63/469,000, filed on May 25, 2023.

(51) Int. Cl.
*H03H 9/02* (2006.01)
*H03H 9/05* (2006.01)
(Continued)

(52) U.S. Cl.
CPC .... *H03H 9/02574* (2013.01); *H03H 9/02551* (2013.01); *H03H 9/02559* (2013.01); *H03H 9/02834* (2013.01); *H03H 9/02897* (2013.01); *H03H 9/02913* (2013.01); *H03H 9/059* (2013.01); *H03H 9/1085* (2013.01); *H03H 9/6483* (2013.01)

(58) Field of Classification Search
CPC ........... H03H 9/02574; H03H 9/02551; H03H 9/02559; H03H 9/02834; H03H 9/02897; H03H 9/02913; H03H 9/059; H03H 9/1085; H03H 9/6483; H03H 9/1071; H01Q 1/2283; H01Q 23/00
USPC ................................................. 333/193–196
See application file for complete search history.

(56) References Cited

U.S. PATENT DOCUMENTS 3,786,373 A 1/1974 Schulz et al.
3,983,515 A 9/1976 Mitchell et al.
(Continued)

FOREIGN PATENT DOCUMENTS

CN 114497114 A 5/2022
CN 115242214 A 10/2022
(Continued)

OTHER PUBLICATIONS

Lee et al., "A cost-effective MEMS cavity packaging technology for mass production", IEEE Trans. Adv. Packaging, vol. 32(2):453-480 (2009).

*Primary Examiner* — Jorge L Salazar, Jr.
(74) *Attorney, Agent, or Firm* — VIA LLP

(57) ABSTRACT

A packaged acoustic wave component is disclosed. The packaged acoustic wave component can include a wafer level packaging structure having a shield structure base, a multi-layer piezoelectric substrate including a piezoelectric layer and a support substrate, and an interdigital transducer electrode in electrical communication with the piezoelectric layer. A difference between a coefficient of thermal expansion of the shield structure base and a coefficient of thermal expansion of the support substrate is 13 ppm/deg or less.

20 Claims, 7 Drawing Sheets

(51) Int. Cl.
*H03H 9/10* (2006.01)
*H03H 9/64* (2006.01)

(56) References Cited

U.S. PATENT DOCUMENTS 4,097,825 A 6/1978 Gerard
4,204,178 A 5/1980 Mitchell
4,634,914 A 1/1987 Ballato
4,773,138 A 9/1988 Ballato et al.
4,996,165 A 2/1991 Chang et al.
5,113,115 A 5/1992 Mariani
5,163,435 A 11/1992 Soldner et al.
5,245,734 A 9/1993 Issartel
5,508,667 A 4/1996 Kondratiev et al.
5,646,584 A 7/1997 Kondratyev et al.
5,895,996 A 4/1999 Takagi et al.
5,952,899 A 9/1999 Kadota et al.
6,046,524 A 4/2000 Yamanouchi et al.
6,262,513 B1 7/2001 Furukawa et al.
6,426,583 B1 7/2002 Onishi et al.
6,608,363 B1 8/2003 Fazelpour
6,637,087 B1 10/2003 Horiuchi et al.
7,202,590 B2 4/2007 Matsuda et al.
7,230,512 B1 6/2007 Carpenter et al.
7,733,196 B2 6/2010 Tsurunari et al.
8,174,339 B2 5/2012 Matsuda et al.
8,228,137 B2 7/2012 Inoue et al.
8,378,760 B2 2/2013 Iwaki et al.
8,836,111 B2 9/2014 Conti et al.
9,002,038 B2 4/2015 Ochs et al.
9,118,303 B2 8/2015 Inoue
9,219,467 B2 12/2015 Inoue et al.
9,246,533 B2 1/2016 Fujiwara et al.
9,337,354 B2 5/2016 Protheroe et al.
9,438,201 B2 9/2016 Hori et al.
9,484,886 B2 11/2016 Takemura
9,520,857 B2 12/2016 Fujiwara et al.
9,570,668 B2 2/2017 Iwamoto
9,722,573 B2 8/2017 Fujiwara et al.
9,822,001 B2 11/2017 Gritti et al.
9,831,850 B2 11/2017 Kuroyanagi
10,153,909 B2 12/2018 Horvth et al.
10,243,536 B2 3/2019 Saijo et al.
10,483,942 B2 11/2019 Goto et al.
10,637,432 B2 4/2020 Kai
11,050,406 B2 6/2021 Maki et al.
11,133,789 B2 9/2021 Maki et al.
11,222,855 B2 1/2022 Yota et al.
11,309,864 B2 4/2022 Ibaragi et al.
11,387,193 B2 7/2022 Yota et al.
11,658,688 B2 5/2023 Abbott et al.
11,671,072 B2 6/2023 Goto et al.
11,677,377 B2 6/2023 Goto et al.
11,689,178 B2 6/2023 Nakamura et al.
11,830,826 B2 11/2023 Yota et al.
12,009,795 B2 6/2024 Abbott et al.
12,047,053 B2 7/2024 Maki et al.
2002/0158707 A1 10/2002 Noguchi
2002/0163402 A1 11/2002 Tsuzuki et al.
2003/0011577 A1 1/2003 Katsuki et al.
2004/0196119 A1 10/2004 Shibahara et al.
2004/0232802 A1 11/2004 Koshido
2006/0197630 A1 9/2006 Fuse
2007/0044296 A1 3/2007 Jeon et al.
2007/0080612 A1 4/2007 Terazono et al.
2011/0084382 A1 4/2011 Chen et al.
2011/0254639 A1 10/2011 Tsutsumi et al.
2013/0113576 A1 5/2013 Inoue et al.
2013/0285768 A1 10/2013 Watanabe et al.
2014/0009032 A1 1/2014 Takahashi et al.
2014/0113571 A1 4/2014 Fujiwara et al.
2014/0339957 A1 11/2014 Tajima et al.
2016/0028373 A1 1/2016 Costa et al.
2016/0172573 A1 6/2016 Iwaki et al.
2016/0268997 A1 9/2016 Komatsu et al.
2017/0063332 A1 3/2017 Gilbert et al.
2017/0099043 A1 4/2017 Goto et al.
2017/0214386 A1 7/2017 Kido
2017/0222618 A1 8/2017 Inoue et al.
2017/0250669 A1 8/2017 Kuroyanagi et al.
2017/0272051 A1 9/2017 Kurihara et al.
2017/0273183 A1 9/2017 Kawasaki et al.
2017/0288627 A1 10/2017 Takano et al.
2017/0288629 A1 10/2017 Bhattacharjee et al.
2017/0331456 A1 11/2017 Ono
2017/0359048 A1 12/2017 Yasuda
2017/0373241 A1 12/2017 Kimura
2018/0013404 A1 1/2018 Kawasaki et al.
2018/0069529 A1 3/2018 Bi et al.
2018/0152169 A1 5/2018 Goto et al.
2018/0152191 A1 5/2018 Niwa et al.
2018/0262179 A1 9/2018 Goto et al.
2018/0316329 A1 11/2018 Guenard et al.
2018/0367119 A1 12/2018 Lee
2019/0238114 A1 8/2019 Kishimoto et al.
2019/0288661 A1 9/2019 Akiyama et al.
2020/0067482 A1 2/2020 Maki et al.
2020/0076402 A1 3/2020 Koo et al.
2020/0228093 A1 7/2020 Daimon
2020/0313646 A1 10/2020 Caron
2020/0321937 A1 10/2020 Kishi et al.
2020/0366270 A1 11/2020 Matsuoka
2021/0020587 A1 1/2021 Yota et al.
2021/0036209 A1 2/2021 Osawa et al.
2021/0050842 A1 2/2021 Tang et al.
2021/0058057 A1 2/2021 Goto et al.
2021/0111688 A1 4/2021 Abbott et al.
2021/0111697 A1 4/2021 Daimon et al.
2021/0118821 A1 4/2021 Yota et al.
2021/0119650 A1 4/2021 Abbott et al.
2021/0159876 A1 5/2021 Maki et al.
2021/0159886 A1 5/2021 Goto et al.
2021/0218381 A1 7/2021 Luo et al.
2021/0265970 A1 8/2021 Yamaji et al.
2021/0296196 A1 9/2021 Ostrowicki et al.
2022/0014175 A1 1/2022 Nagatomo et al.
2022/0077840 A1 3/2022 Caron
2022/0103146 A1 3/2022 Wang
2022/0158610 A1 5/2022 Goto et al.
2022/0158611 A1 5/2022 Potratz et al.
2022/0158612 A1 5/2022 Goto et al.
2022/0216845 A1* 7/2022 Yamane ............. H03H 9/02157
2022/0329227 A1 10/2022 Goto et al.
2022/0399867 A1 12/2022 Goto et al.
2022/0399871 A1 12/2022 Goto et al.
2023/0006125 A1 1/2023 Goto et al.
2023/0006636 A1 1/2023 Goto et al.
2023/0006637 A1 1/2023 Goto et al.
2023/0013597 A1 1/2023 Goto et al.
2023/0016884 A1 1/2023 Goto et al.
2023/0028925 A1 1/2023 Kobayashi
2023/0055758 A1 2/2023 Goto et al.
2023/0062981 A1 3/2023 Fukuhara et al.
2023/0101228 A1 3/2023 Brunner et al.
2023/0104405 A1 4/2023 Hiramatsu et al.
2023/0109106 A1 4/2023 Hiramatsu et al.
2023/0110477 A1 4/2023 Maki et al.
2023/0111032 A1 4/2023 Goto et al.
2023/0111849 A1 4/2023 Maki et al.
2023/0113099 A1 4/2023 Goto et al.
2023/0117464 A1 4/2023 Goto et al.
2023/0118194 A1 4/2023 Goto et al.
2023/0119788 A1 4/2023 Goto et al.
2023/0208376 A1 6/2023 Goto et al.
2023/0208384 A1 6/2023 Goto et al.
2023/0208389 A1 6/2023 Goto et al.
2023/0208398 A1 6/2023 Goto et al.
2023/0208399 A1 6/2023 Goto et al.
2023/0223910 A1 7/2023 Goto et al.
2023/0223917 A1 7/2023 Goto et al.
2023/0223919 A1 7/2023 Goto et al.
2023/0225212 A1 7/2023 Goto et al.
2023/0291385 A1 9/2023 Okamoto et al.
2023/0336145 A1 10/2023 Goto et al.

(56) References Cited

U.S. PATENT DOCUMENTS

| | | | |
|---|---|---|---|
| 2023/0344403 A1 | 10/2023 | Goto et al. | |
| 2023/0344416 A1 | 10/2023 | Chen et al. | |
| 2023/0370044 A1 | 11/2023 | Goto et al. | |
| 2023/0403939 A1 | 12/2023 | Goto et al. | |
| 2024/0007079 A1 | 1/2024 | Goto et al. | |
| 2024/0039507 A1 | 2/2024 | Goto et al. | |
| 2024/0039516 A1 | 2/2024 | Goto et al. | |
| 2024/0048125 A1 | 2/2024 | Goto et al. | |
| 2024/0063773 A1 | 2/2024 | Fukuhara et al. | |
| 2024/0088870 A1 | 3/2024 | Goto et al. | |
| 2024/0178812 A1 | 5/2024 | Goto et al. | |
| 2024/0178814 A1 | 5/2024 | Goto et al. | |
| 2024/0223152 A1 | 7/2024 | Goto et al. | |
| 2024/0396518 A1 | 11/2024 | Goto et al. | |
| 2025/0294839 A1* | 9/2025 | Song .................... | H10D 62/824 |
| 2025/0317121 A1 | 10/2025 | Noriaki et al. | |
| 2025/0317123 A1 | 10/2025 | Tajima et al. | |
| 2025/0317124 A1 | 10/2025 | Tajima et al. | |
| 2025/0317125 A1 | 10/2025 | Rei et al. | |

FOREIGN PATENT DOCUMENTS

| | | |
|---|---|---|
| WO | 2015/098679 A1 | 7/2015 |
| WO | 2020/098481 A1 | 5/2020 |
| WO | 2022/022264 A1 | 2/2022 |
| WO | 2022/163409 A1 | 8/2022 |

* cited by examiner

PACKAGED ACOUSTIC WAVE DEVICES WITH MULTILAYER PIEZOELECTRIC SUBSTRATE

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/469,000, filed May 25, 2023, titled "PACKAGED ACOUSTIC WAVE DEVICES WITH MULTILAYER PIEZOELECTRIC SUBSTRATE," are hereby incorporated by reference under 37 CFR 1.57 in their entirety.

BACKGROUND

Field

Embodiments of the disclosure relate to acoustic wave devices, in particular to packaged acoustic wave components, which may also be designated as acoustic wave component packages.

Description of the Related Technology

An acoustic wave filter can include a plurality of resonators arranged to filter a radio frequency signal. Example acoustic wave resonators include surface acoustic wave (SAW) resonators and bulk acoustic wave (BAW) resonators. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. A multi-mode SAW filter can include a plurality of longitudinally coupled interdigital transducer electrodes positioned between acoustic reflectors. Multi-layer piezoelectric substrate (MPS) SAW resonators and temperature compensated (TC) SAW resonators are examples of SAW devices.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, three acoustic wave filters can be arranged as a triplexer. As another example, four acoustic wave filters can be arranged as a quadplexer.

An acoustic wave device, such as a SAW device, can be packaged to define a packaged acoustic wave device or component.

SUMMARY

Accordingly, there is a need for a packaged acoustic wave component, in particular a surface acoustic wave (e.g., SAW) package with improved reliability that can withstand the stresses (e.g., from heat cycle testing) during the packaging process.

The innovations described in the claims each have several aspects, no single one of which is solely responsible for its desirable attributes. Without limiting the scope of the claims, some prominent features of this disclosure will now be briefly described.

In a first aspect, a packaged acoustic wave component is disclosed. The packaged acoustic wave component includes a wafer level packaging structure. The wafer level packaging structure has a shield structure base. The packaged acoustic wave component also includes a multi-layer piezoelectric substrate (MPS) including at least one non-conductive layer. The at least one non-conductive layer has a coefficient of thermal expansion that is substantially the same as a coefficient of thermal expansion of the shield structure base.

A coefficient of thermal expansion (CTE) is substantially the same according to this application when a difference between the CTE of the shield structure base and the CTE of the at least one non-conductive layer is 13 ppm/deg or less.

Such a packaged acoustic wave component provides a lower thermal distortion of the wafer level packaging structure and the MPS.

In a second aspect, a radio frequency module is disclosed. The radio frequency module includes a packaged acoustic wave component. The packaged acoustic wave component includes a wafer level packaging structure. The wafer level packaging structure has a shield structure base. The packaged acoustic wave component also includes a multi-layer piezoelectric substrate (MPS) including at least one non-conductive layer. The at least one non-conductive layer has a coefficient of thermal expansion that is substantially the same as a coefficient of thermal expansion of the shield structure base.

In a third aspect, a wireless communication device is disclosed. The wireless communication device includes a radio frequency module comprising a packaged acoustic wave component. The packaged acoustic wave component includes a wafer level packaging structure. The wafer level packaging structure has a shield structure base. The packaged acoustic wave component also includes a multi-layer piezoelectric substrate (MPS) including at least one non-conductive layer. The at least one non-conductive layer has a coefficient of thermal expansion that is substantially the same as a coefficient of thermal expansion of the shield structure base.

In some aspects, the techniques described herein relate to a packaged acoustic wave component including: a wafer level packaging structure having a shield structure base; a multi-layer piezoelectric substrate including a piezoelectric layer and a support substrate, a difference between a coefficient of thermal expansion of the shield structure base and a coefficient of thermal expansion of the support substrate being 13 ppm/deg or less; and an interdigital transducer electrode in electrical communication with the piezoelectric layer.

In some embodiments, the techniques described herein relate to a packaged acoustic wave component wherein the difference between the coefficient of thermal expansion of the shield structure base and the coefficient of thermal expansion of the support substrate is 10 ppm/deg or less.

In some embodiments, the techniques described herein relate to a packaged acoustic wave component wherein the difference between the coefficient of thermal expansion of the shield structure base and the coefficient of thermal expansion of the support substrate is 4 ppm/deg or less.

In some embodiments, the techniques described herein relate to a packaged acoustic wave component wherein the coefficient of thermal expansion of the shield structure base has a value around 16.5 ppm/deg.

In some embodiments, the techniques described herein relate to a packaged acoustic wave component wherein the coefficient of thermal expansion of support substrate has a value from around 3.5 ppm/deg to around 24 ppm/deg.

In some embodiments, the techniques described herein relate to a packaged acoustic wave component wherein the coefficient of thermal expansion of the support substrate has a value from around 4 ppm/deg to around 20 ppm/deg.

In some embodiments, the techniques described herein relate to a packaged acoustic wave component wherein the support substrate includes sapphire.

In some embodiments, the techniques described herein relate to a packaged acoustic wave component wherein the piezoelectric layer includes lithium tantalate.

In some embodiments, the techniques described herein relate to a packaged acoustic wave component wherein the piezoelectric layer includes lithium niobate.

In some embodiments, the techniques described herein relate to a packaged acoustic wave component wherein the support substrate includes glass.

In some embodiments, the techniques described herein relate to a packaged acoustic wave component wherein the support substrate includes spinel.

In some embodiments, the techniques described herein relate to a packaged acoustic wave component wherein the support substrate includes quartz.

In some embodiments, the techniques described herein relate to a packaged acoustic wave component wherein the wafer level packaging structure includes a polymeric body having a conductive via passing through the polymeric body.

In some embodiments, the techniques described herein relate to a packaged acoustic wave component wherein the shield structure base includes copper. 15.

In some embodiments, the techniques described herein relate to a packaged acoustic wave component wherein the wafer level packaging structure further includes a pillar between the multi-layer piezoelectric substrate and at least a portion of the shield structure base.

In some aspects, the techniques described herein relate to a radio frequency module with a packaged acoustic wave component including: a wafer level packaging structure having a shield structure base; a multi-layer piezoelectric substrate including a piezoelectric layer and a support substrate, a difference between a coefficient of thermal expansion of the shield structure base and a coefficient of thermal expansion of the support substrate being 13 ppm/deg or less; and an interdigital transducer electrode in electrical communication with the piezoelectric layer.

In some embodiments, the techniques described herein relate to a radio frequency module wherein the radio frequency module is configured as a front end module.

In some aspects, the techniques described herein relate to a wireless communication device including: a radio frequency module including a packaged acoustic wave component, the packaged acoustic wave component including a wafer level packaging structure having a shield structure base; a multi-layer piezoelectric substrate including a piezoelectric layer and a support substrate; and an interdigital transducer electrode in electrical communication with the piezoelectric layer, a difference between a coefficient of thermal expansion of the shield structure base and a coefficient of thermal expansion of the support substrate being 13 ppm/deg or less; and an antenna operatively coupled to the radio frequency module.

In some embodiments, the techniques described herein relate to a wireless communication device further including a radio frequency amplifier operatively coupled to the radio frequency module and configured to amplify a radio frequency signal.

In some embodiments, the techniques described herein relate to a wireless communication device further including a transceiver in communication with the radio frequency amplifier. 22.

In some aspects, packaged multi-layer piezoelectric substrate surface acoustic wave device including: a multi-layer piezoelectric substrate including a piezoelectric layer and a quartz substrate; an interdigital transducer electrode in electrical communication with the piezoelectric layer; and a packaging structure having a coefficient of thermal expansion greater than 0 ppm/° C. and equal to or less than 35 ppm/° C., the packaging structure coupled to the multi-layer piezoelectric substrate, the interdigital transducer electrode positioned between the quartz substrate and the packaging structure.

In some embodiments, the techniques described herein relate to a surface acoustic wave device wherein the coefficient of thermal expansion of the packaging structure is greater than 10 ppm/° C. and equal to or less than 30 ppm/° C.

In some embodiments, the techniques described herein relate to a surface acoustic wave device wherein a difference between a coefficient of thermal expansion of the quartz substrate and a coefficient of thermal expansion of a shield structure base of the packaging structure is 13 ppm/deg or less.

In some embodiments, the techniques described herein relate to a surface acoustic wave device wherein the packaging structure includes a shield structure base and a pillar at least partially between the multi-layer piezoelectric substrate and the shield structure base.

In some embodiments, the techniques described herein relate to a surface acoustic wave device further includes a second interdigital transducer electrode, at least a portion of the pillar is positioned between the interdigital transducer electrode and the second interdigital transducer electrode.

In some embodiments, the techniques described herein relate to a surface acoustic wave device wherein the In some embodiments, the techniques described herein relate to packaging structure includes a terminal.

In some embodiments, the techniques described herein relate to a surface acoustic wave device further including a routing structure electrically connected to the interdigital transducer electrode.

In some embodiments, the techniques described herein relate to a surface acoustic wave device wherein the interdigital transducer electrode is electrically coupled to the terminal at least partially through the routing structure.

In some embodiments, the techniques described herein relate to a surface acoustic wave device wherein the terminal is an external electrode, and the routing structure includes a metallization pattern of electrical trace.

In some embodiments, the techniques described herein relate to a surface acoustic wave device wherein the packaging structure includes copper.

In some embodiments, the techniques described herein relate to a surface acoustic wave device wherein bulk of the packaging structure is copper.

In some aspects, the techniques described herein relate to a radio frequency module including: a packaged multi-layer piezoelectric substrate surface acoustic wave device including a multi-layer piezoelectric substrate having a piezoelectric layer and a quartz substrate, an interdigital transducer electrode in electrical communication with the piezoelectric layer, and a packaging structure having a coefficient of thermal expansion greater than 0 ppm/° C. and equal to or less than 35 ppm/° C., the packaging structure coupled to the multi-layer piezoelectric substrate, the interdigital transducer electrode positioned between the quartz substrate and the packaging structure; and an antenna coupled to the packaged multi-layer piezoelectric substrate surface acoustic wave device.

In some embodiments, the techniques described herein relate to a radio frequency module wherein the coefficient of thermal expansion of the packaging structure is greater than 10 ppm/° C. and equal to or less than 30 ppm/° C.

In some embodiments, the techniques described herein relate to a radio frequency module wherein a difference between a coefficient of thermal expansion of the quartz substrate and a coefficient of thermal expansion of a shield structure base of the packaging structure is 13 ppm/deg or less.

In some embodiments, the techniques described herein relate to a radio frequency module wherein the packaged multi-layer piezoelectric substrate surface acoustic wave device includes a routing structure electrically connected to the interdigital transducer electrode, and the packaging structure includes a terminal electrically coupled to the interdigital transducer electrode at least partially through the routing structure.

In some embodiments, the techniques described herein relate to a radio frequency module further including a package substrate, wherein the packaged multi-layer piezoelectric substrate surface acoustic wave device is electrically coupled to the package substrate through the terminal.

In some aspects, the techniques described herein relate to a wireless communication device including: a filter including a multi-layer piezoelectric substrate having a piezoelectric layer and a quartz substrate, an interdigital transducer electrode in electrical communication with the piezoelectric layer, and a packaging structure having a coefficient of thermal expansion greater than 0 ppm/° C. and equal to or less than 35 ppm/° C., the packaging structure coupled to the multi-layer piezoelectric substrate, the interdigital transducer electrode positioned between the quartz substrate and the packaging structure; a transceiver coupled between the filter and a processor; and an antenna coupled to filter.

In some embodiments, the techniques described herein relate to a wireless communication device wherein the coefficient of thermal expansion of the packaging structure is greater than 10 ppm/° C. and equal to or less than 30 ppm/° C.

In some embodiments, the techniques described herein relate to a wireless communication device wherein a difference between a coefficient of thermal expansion of the quartz substrate and a coefficient of thermal expansion of a shield structure base of the packaging structure is 13 ppm/deg or less.

In some embodiments, the techniques described herein relate to a wireless communication device wherein the filter and other plurality of filters are included in a radio frequency front end coupled between the transceiver and the antenna.

The present disclosure relates to U.S. patent application Ser. No. 18/673,896, titled "PACKAGED ACOUSTIC WAVE DEVICES WITH MULTILAYER PIEZOELECTRIC SUBSTRATE HAVING QUARTZ SUBSTRATE," filed on even date herewith, the entire disclosure of which is hereby incorporated by reference herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

DETAILED DESCRIPTION OF EMBODIMENTS

Figure 1A:
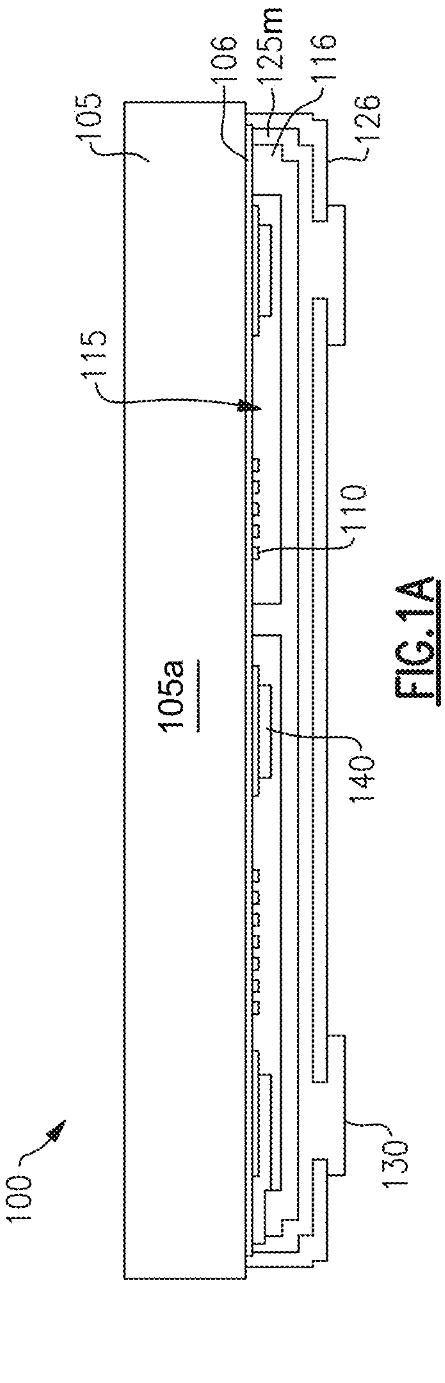
FIG. 1A is a cross-sectional side view of a packaged acoustic wave component according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double mode SAW (DMS) filters). Any features of the SAW resonators and/or devices discussed herein can be implemented in any suitable SAW device such as a multilayer piezoelectric substrate (MPS) SAW device.

A multilayer piezoelectric substrate (MPS) surface acoustic wave (SAW) device can include a support substrate, a piezoelectric layer over the support substrate, and an interdigital transducer (IDT) electrode formed with the piezoelectric layer. The thermal dissipation ability of the MPS-SAW device is generally greater than other types of SAW devices, such as a temperature compensated (TC) SAW device that includes a temperature compensation layer over the IDT electrode.

In general, high quality factor (Q), large effective electromechanical coupling coefficient (k2), high frequency ability, and spurious free response can be significant aspects for acoustic wave elements to enable low-loss filters, delay lines, stable oscillators, and sensitive sensors.

Multi-layer piezoelectric substrate (MPS) acoustic wave devices can thermally insulate an interdigital transducer electrode and a piezoelectric layer. By reducing dissipative thermal impedance of the acoustic wave device, the ruggedness and power handling can be improved. Furthermore, MPS acoustic wave devices can include a high power durability filter solution.

Some MPS acoustic wave devices have achieved a packaging structure with copper (Cu) shield based wafer level packagings in combination with a silicon (Si) substrate. However, such approaches have encountered technical challenges related to thermal distortion of the substrate and the wafer level packaging.

A SAW device can be packaged as a packaged SAW device. The packaged SAW device includes the SAW device and a packaging structure coupled to the SAW device. A coefficient of thermal expansion mismatch between the SAW device and the packaging structure can cause mechanical distortion, which can lead to temperature cycle test failures. In TC-SAW devices, typically, the piezoelectric layer (e.g., a lithium niobate layer or a lithium tantalate layer) can have a relatively high coefficient of thermal expansion and a relatively low Young's modulus, and the TC-SAW devices may have a high temperature cycle reliability. However, as compared to MPS-SAW devices the TC-SAW devices typically have lower device performance. A packaging structure that includes a relatively low coefficient of thermal expansion material (e.g., silicon) can be used to reduce a coefficient of thermal expansion mismatch between the substrate of the MPS-SAW devices. However, a silicon packaging structure can cause direct current (DC) leakage in some applications, which can degrade the device performance. The DC leakage can be electrical current leakage through, for example, a substrate of the SAW device.

Various embodiments disclosed herein relate to packaged multilayer piezoelectric substrate (MPS) surface acoustic wave (SAW) devices that enable improved temperature cycle reliability and reduced DC leakage. A packaged MPS-SAW device according to some embodiments includes an MPS-SAW device and a packaging structure coupled to the SAW device. The MPS-SAW device includes a support substrate, a piezoelectric layer, and an interdigital transducer electrode in electrical communication with the piezoelectric layer. The packaging structure can include a shield structure base. A difference between a coefficient of thermal expansion of the shield structure base and a coefficient of thermal expansion of the support substrate is 10 ppm/deg or less. The support substrate can be a quartz substrate.

Figure 1B:
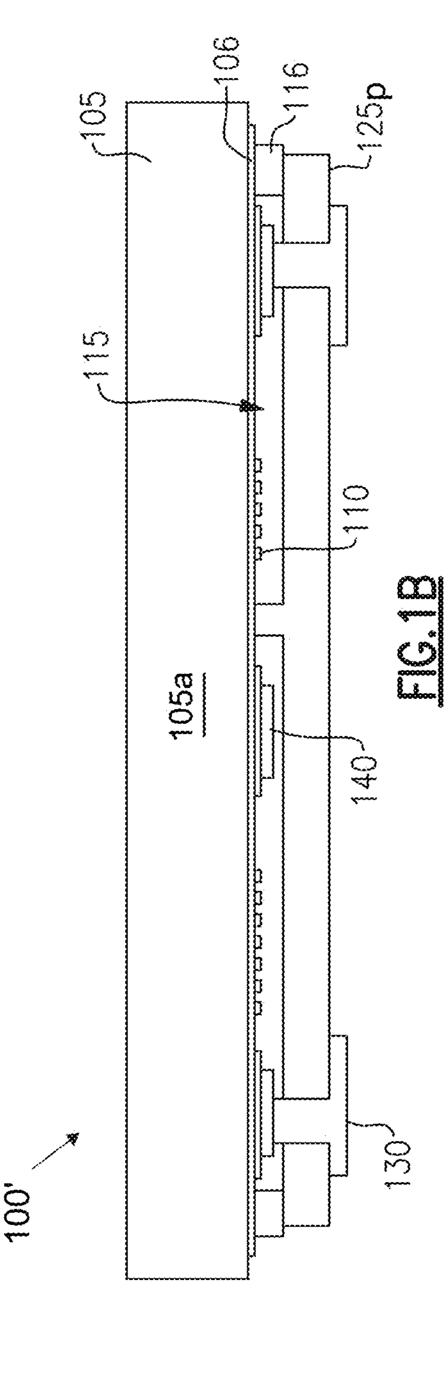
FIG. 1B is a cross-sectional side view of a packaged acoustic wave component according to an embodiment.

FIG. 1A is a schematic cross-sectional side view of a packaged acoustic wave component 100 according to an embodiment. FIG. 1B is a schematic cross-sectional side view of a packaged acoustic wave component 100' according to an embodiment. In some embodiments, the packaged acoustic wave component 100, 100' can be a packaged SAW filter. The acoustic wave component 100 can be a packaged multi-layer piezoelectric substrate surface acoustic wave (MPS-SAW) device. The acoustic wave component 100, 100' can includes a multi-layer piezoelectric substrate (MPS) 105 with at least one non-conductive layer 105*a*, for example, a quartz (Qz) substrate layer, a lithium tantalate (LT or LiTaO3) substrate layer, a lithium niobate (LN or LiNbO3) substrate layer, a glass substrate layer, a spinel (MgAlO4) substrate layer or a sapphire substrate layer. The at least one non-conductive layer 105*a* can be referred to as a support substrate. The MPS 105 can further include a piezoelectric layer 106 positioned below the at least one non-conductive layer. Interdigital transducer (IDT) electrodes 110 of the acoustic wave component 100, 100' are in electrical communication with the piezoelectric layer 106. The IDT electrodes 110 can be disposed on the MPS 105 within a cavity 115 defined in the acoustic wave component 100, 100'. The cavity 115 is limited at least partly by a pillar (e.g., a polyimide cavity pillar 116), for example as illustrated in FIGS. 1A and 1B. The polyimide cavity pillar 116 is bonded to the MPS 105 around the IDT electrodes 110 and seals (e.g., hermetically seals) the cavity 115. In some embodiments, the polyimide cavity pillar 116 fully circumscribes the cavity 115. At least a portion of the pillar can be positioned between a first interdigital transducer electrode and a second interdigital transducer electrode of the IDT electrodes 110.

Furthermore, the packaged acoustic wave component 100 according to FIG. 1A can include a packaging structure (e.g., a wafer level packaging structure 102) having a metal shield structure base 125*m*. Preferably, the metal shield structure base 125*m* includes or consists of copper. In particular, the metal shield structure base 125*m* can be a copper plate or a copper layer. In some embodiments, the copper based metal shield structure base 125*m* may be coated by a buffer coat 126. Alternatively, the wafer level packaging structure 102 of the acoustic wave component 100' may have a polymer shield structure base 125*p* as shown in FIG. 1B. The polymer shield structure base 125*p* can include silica filler polymer. The silica filler polymer based shield structure base 125*p* can provide a higher Young module and a lower coefficient of thermal expansion than polymer without the silica filler. A coefficient of thermal expansion of the wafer level packaging structure 102 can be, for example, greater than 0 ppm/° C. and equal to or less than 35 ppm/° C., or greater than 10 ppm/° C. and equal to or less than 30 ppm/° C. In some embodiments, bulk (e.g., more than 50% in volume or more than 50% in mass) of the packaging structure can be copper.

The at least one non-conductive layer 105*a* of the MPS 105 has a coefficient of thermal expansion (CTE) that is substantially the same as a CTE of the the metal shield structure base 125*m* of FIG. 1A) and polymer shield structure base 125*p* of FIG. 1B. A CTE is substantially the same according to this application when a difference between the CTE of the shield structure base (the shield structure base 125*m* of FIG. 1A or the shield structure base 125*p* of FIG. 1B) and the CTE of the at least one non-conductive layer is 13 ppm/deg or less.

In some embodiments, the acoustic wave component 100, 100' may include a terminal (e.g., an external electrode 130).

In some embodiments, the acoustic wave component 100, 100' may include a routing structure (e.g., a metallization pattern of electrical traces 140) disposed on the piezoelectric layer 106. Further, the acoustic wave component 100, 100' may be mounted on a printed circuit board or other substrate and the acoustic wave component 100, 100' may electrically communicate with other devices on the circuit board. The IDT electrode 110 can be electrically coupled to the terminal (e.g., the external electrode 130) at least partially through the metallization pattern of electrical traces 140.

It should be appreciated that although a SAW filter is illustrated in FIGS. 1A and 1B as an example of an acoustic wave component, other forms of packaged acoustic wave devices or other types of MEMS devices may be utilized in the illustrated packaged acoustic wave component.

Advantageously, the SAW filter 100, 100' has less thermal distortion than an MPS filter with a Si substrate. This can contribute to improving reliability and mechanical ruggedness of the packaged acoustic wave component for packaging processes, in particular in mass production. Furthermore, it can provide a good acoustic energy confinement material for MPS, and a reliable packaging with wafer level packaging thereby maintaining a desired electrical performance.

Figure 2:
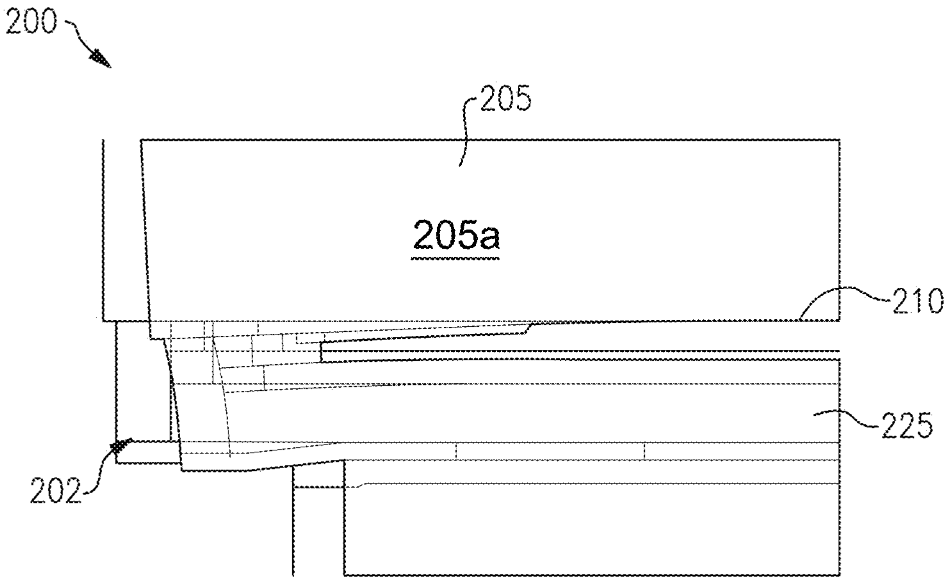
FIG. 2 is a cross-sectional side view of a packaged acoustic wave component in a thermal stress situation according to an embodiment.

FIG. 2 illustrates a cross-sectional side view of a portion of a packaged acoustic wave component 200 in a thermal stress situation according to an embodiment. A shear stress deformation of the packaged acoustic wave component 200 is shown in FIG. 2, wherein the component 200 is illustrated in the back of FIG. 2 in an undistorted view as reference for the small exemplary thermal distortion.

The packaged acoustic wave component 200 has a wafer level packaging structure 202 having a metal shield structure base 225. The metal shield structure base 225 can be formed as a pad or a layer. The metal shield structure base 225 can be made of or consist of copper, copper alloy or similar metal shields. For example, the metal shield structure base 225 can be a copper pad or copper layer. The metal shield structure base 225 can be configured as a leadframe. The metal shield structure base 225 can include a conductive trace, a conductive line, a conductive plate, and/or a conductive via, and be configured to provide electrical routing at least partially between the IDT electrodes 110 and the external electrode 130.

The packaged acoustic wave component 200 also has a multi-layer piezoelectric substrate (MPS) 205 including at least one non-conductive layer. The MPS 205 can include a support substrate 205*a* and a piezoelectric layer 210. Preferably, the at least one non-conductive layer (the support substrate 205) is formed from (e.g., includes) or consists of quartz (Qz). However, the at least one non-conductive layer is not limited to quartz. Alternatively, the at least one non-conductive layer can be selected from the group of sapphire, lithium tantalate, lithium niobate, glass, and spinel ($MgAlO4$).

The at least one non-conductive layer has a coefficient of thermal expansion (CTE) that is substantially the same as a CTE of the metal shield structure base 225. Optionally, a difference between the CTE of the metal shield structure base 225 and the CTE of the at least one non-conductive layer can be 10 ppm/deg or less, in particular 4 ppm/deg or less.

In some embodiments, the metal shield structure base 225 is made of copper. The coefficient of thermal expansion of the metal shield structure base 225 can have a value around 16.5 ppm/deg. Independent of or in combination with that, the CTE of the at least one non-conductive layer can have a value from around 3.5 ppm/deg to around 24 ppm/deg, in particular from around 4 ppm/deg to around 20 ppm/deg. For example, the packaged acoustic wave component 200 includes the MPS 205 with quartz and the metal shield structure base 225 based on copper for lowering the costs of the component 200. The CTE of the quartz based MPS can have a value around 13.7 ppm/deg. The CTE of lithium niobate can have a value around 15.4 ppm/deg, spinel can have a value around 7.3 ppm/deg.

Advantageously, the packaged acoustic wave component 200 has less thermal distortion than an MPS with a Si substrate. This results in improved reliability and mechanical ruggedness of the packaged acoustic wave component 200 for packaging processes, in particular in mass production. Furthermore, it provides a good acoustic energy confinement material for MPS and a reliable packaging with wafer level packaging, thereby maintaining a desired electrical performance.

An MPS acoustic wave resonator or device or die in a packaged acoustic wave component, including any suitable combination of features disclosed herein, can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS acoustic wave resonators disclosed herein. FR1 can range from 410 MHz to 7.125 GHz, for example, as specified in a current 5G NR specification. In 5G applications, the thermal dissipation of the MPS acoustic wave devices disclosed herein can be advantageous. For example, such thermal dissipation can be desirable in 5G applications with a higher time-division duplexing (TDD) duty cycle compared to fourth generation (4G) Long Term Evolution (LTE). One or more MPS acoustic wave devices in accordance with any suitable principles and advantages disclosed herein can be included in a filter arranged to filter a radio frequency signal in a 4G LTE operating band and/or in a filter having a passband that includes a 4G LTE operating band and a 5G NR operating band.

Figure 3A:
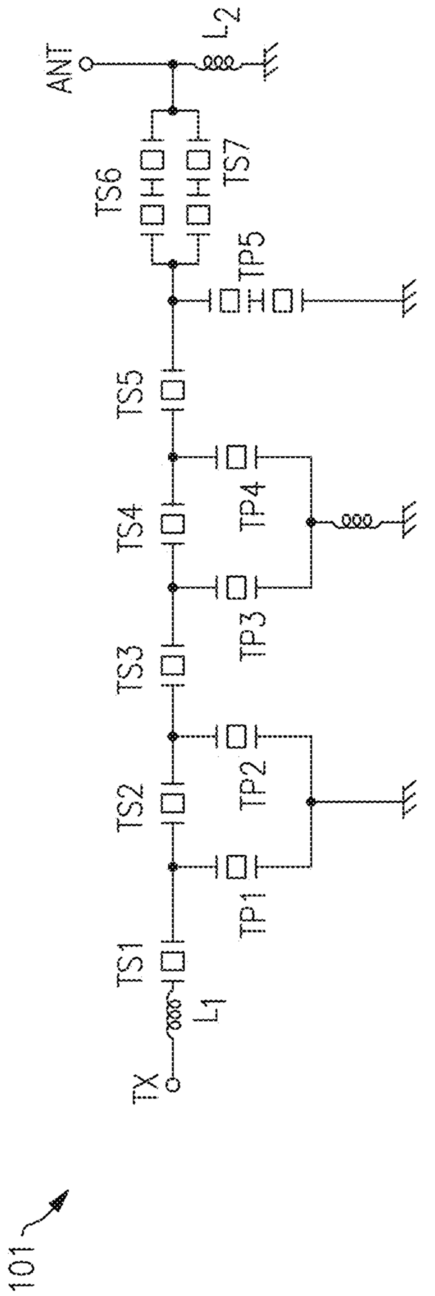
FIG. 3A is a schematic diagram of a transmit filter that includes a surface acoustic wave resonator according to an embodiment.

FIG. 3A is a schematic diagram of an example transmit filter 101 that includes surface acoustic wave resonators according to an embodiment. The transmit filter 101 can be a band pass filter. The illustrated transmit filter 101 is arranged to filter a radio frequency signal received at a transmit port TX and provide a filtered output signal to an antenna port ANT. Some or all of the SAW resonators TS1 to TS7 and/or TP1 to TP5 can be a SAW resonator in accordance with any suitable principles and advantages disclosed herein. For instance, one or more of the SAW resonators of the transmit filter 101 can be part of one or more of the packaged acoustic wave components such as the packaged acoustic wave components 100, 200 of any of FIGS. 1-2. Any suitable number of series SAW resonators and shunt SAW resonators can be included in a transmit filter 101.

Figure 3B:
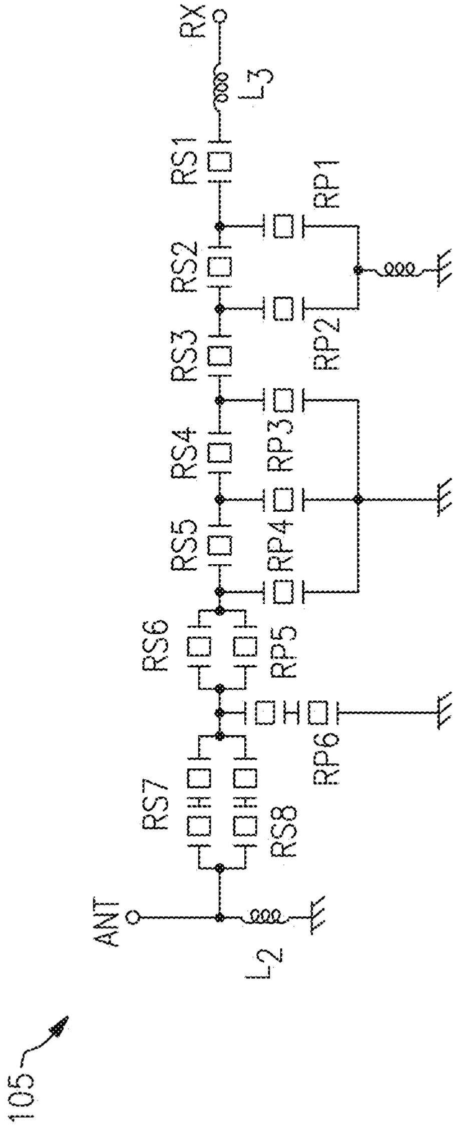
FIG. 3B is a schematic diagram of a receive filter that includes a surface acoustic wave resonator according to an embodiment.

FIG. 3B is a schematic diagram of a receive filter 105 that includes surface acoustic wave resonators according to an embodiment. The receive filter 105 can be a band pass filter. The illustrated receive filter 105 is arranged to filter a radio frequency signal received at an antenna port ANT and provide a filtered output signal to a receive port RX. Some or all of the SAW resonators RS1 to RS8 and/or RP1 to RP6 can be SAW resonators included in a packaged acoustic wave component in accordance with any suitable principles and advantages disclosed herein. For instance, one or more of the SAW resonators of the receive filter 105 can be part of one or more of the packaged acoustic wave components 100, 200 of any of FIGS. 1-2. Any suitable number of series SAW resonators and shunt SAW resonators can be included in a receive filter 105.

Although FIGS. 3A and 3B illustrate example ladder filter topologies, any suitable filter topology can include a SAW resonator in accordance with any suitable principles and advantages disclosed herein. Example filter topologies include ladder topology, a lattice topology, a hybrid ladder and lattice topology, a multi-mode SAW filter, a multi-mode SAW filter combined with one or more other SAW resonators, and the like.

Figure 4:
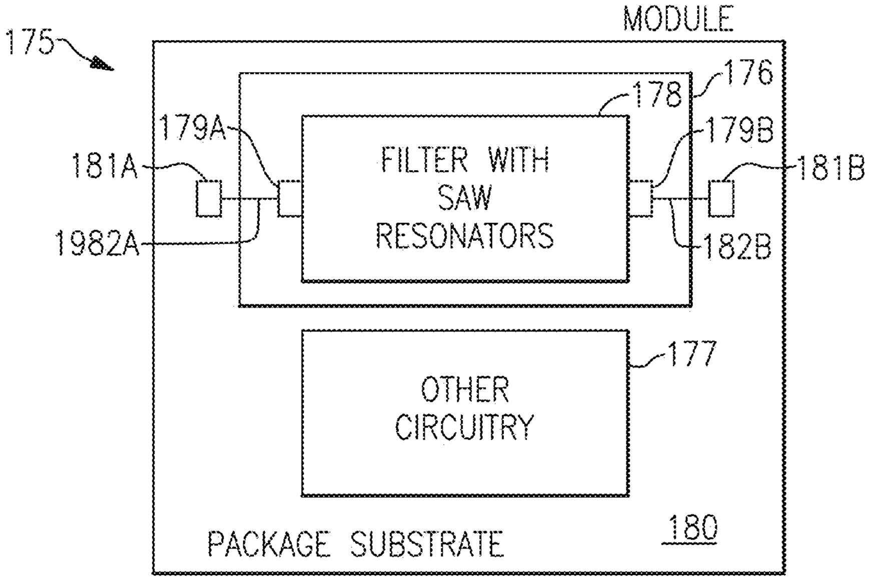
FIG. 4 is a schematic diagram of a radio frequency module that includes a surface acoustic wave resonator according to an embodiment.

FIG. 4 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators or packages disclosed herein. The SAW component 176 can include a SAW die that includes SAW resonators.

The SAW component 176 shown in FIG. 4 includes a filter 178 and terminals 178A and 178B. The filter 178 includes SAW resonators. One or more of the SAW resonators can be implemented in accordance with any suitable principles and advantages of the packaged acoustic wave components 100, 200 of any of FIGS. 1-2. The terminals 178A and 177B can serve, for example, as an input contact and an output contact. The SAW component 176 and the other circuitry 177 are on a common packaging substrate 180 in FIG. 4. The package substrate 180 can be a laminate substrate. The terminals 178A and 178B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 5:
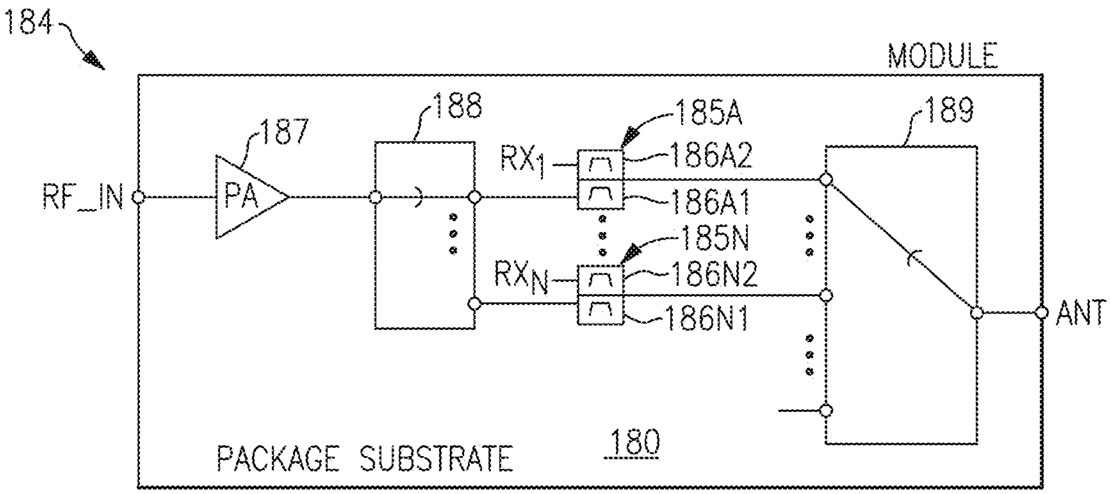
FIG. 5 is a schematic diagram of a radio frequency module that includes filters with surface acoustic wave resonators according to an embodiment.

FIG. 5 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators or packages in accordance with any suitable principles and advantages disclosed herein. Similarly, one or more of the receive filters 186A2 to 186N2 can include one or more SAW resonators in accordance with any suitable principles and advantages disclosed herein. Although FIG. 5 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 6:
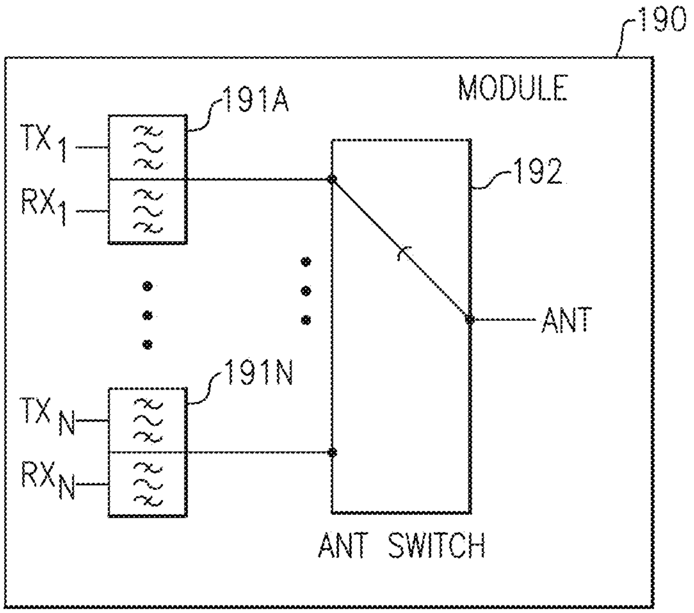
FIG. 6 is a schematic block diagram of a module that includes an antenna switch and duplexers that include a surface acoustic wave resonator according to an embodiment.

FIG. 6 is a schematic block diagram of a module 190 that includes duplexers 191A to 191N and an antenna switch 192. One or more filters of the duplexers 191A to 191N can include any suitable number of surface acoustic wave resonators or packages in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 7A:
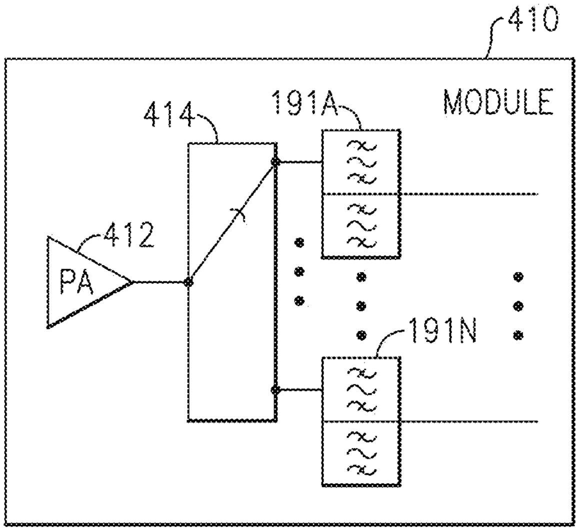
FIG. 7A is a schematic block diagram of a module that includes a power amplifier, a radio frequency switch, and duplexers that include a surface acoustic wave resonator according to an embodiment.

FIG. 7A is a schematic block diagram of a module 410 that includes a power amplifier 412, a radio frequency switch 414, and duplexers 191A to 191N in accordance with one or more embodiments. The power amplifier 412 can amplify a radio frequency signal. The radio frequency switch 414 can be a multi-throw radio frequency switch. The radio frequency switch 414 can electrically couple an output of the power amplifier 412 to a selected transmit filter of the duplexers 191A to 191N. One or more filters of the duplexers 191A to 191N can include any suitable number of surface acoustic wave resonators or packages in accordance with any suitable principles and advantages discussed herein. Any suitable number of duplexers 191A to 191N can be implemented.

Figure 7B:
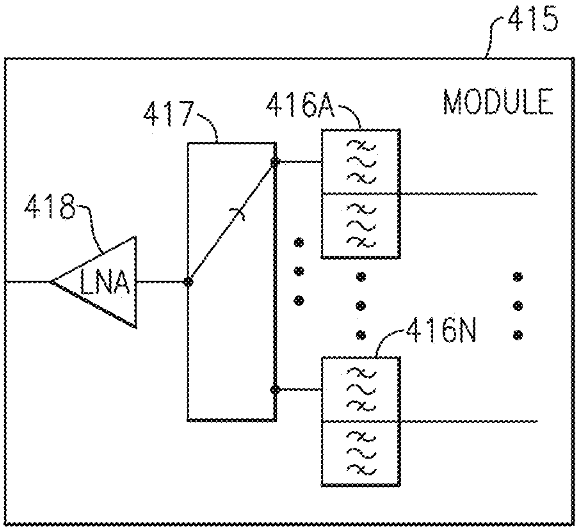
FIG. 7B is a schematic block diagram of a module that includes filters, a radio frequency switch, and a low noise amplifier according to an embodiment.

FIG. 7B is a schematic block diagram of a module 415 that includes filters 416A to 416N, a radio frequency switch 417, and a low noise amplifier 418 according to an embodiment. One or more filters of the filters 416A to 416N can include any suitable number of acoustic wave resonators or packages in accordance with any suitable principles and advantages disclosed herein. Any suitable number of filters 416A to 416N can be implemented. The illustrated filters 416A to 416N are receive filters. In some embodiments (not illustrated), one or more of the filters 416A to 416N can be included in a multiplexer that also includes a transmit filter. The radio frequency switch 417 can be a multi-throw radio frequency switch. The radio frequency switch 417 can electrically couple an output of a selected filter of filters 416A to 416N to the low noise amplifier 418. In some embodiments (not illustrated), a plurality of low noise amplifiers can be implemented. The module 415 can include diversity receive features in certain applications.

Figure 8A:
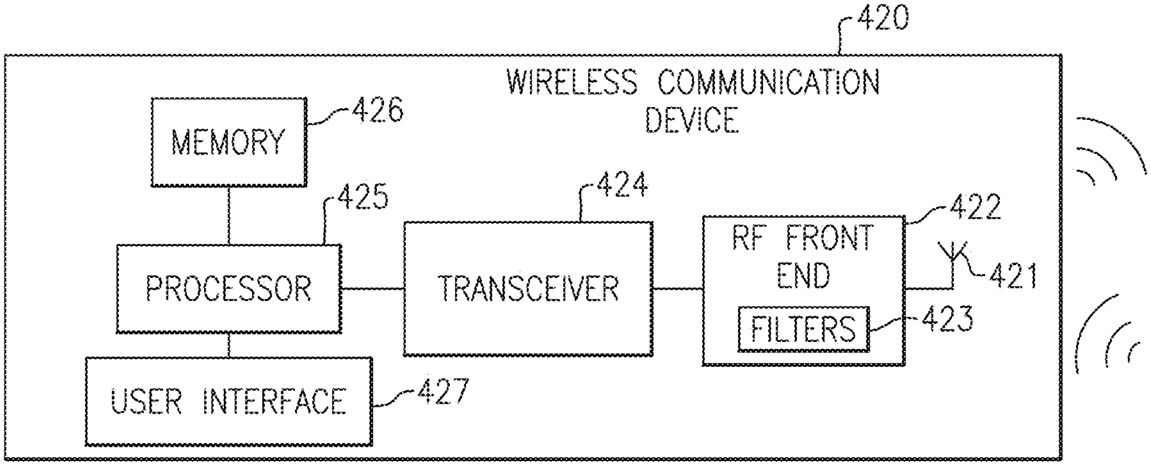
FIG. 8A is a schematic block diagram of a wireless communication device that includes a filter with a surface acoustic wave resonator in accordance with one or more embodiments.

FIG. 8A is a schematic diagram of a wireless communication device 420 that includes filters 423 in a radio frequency front end 422 according to an embodiment. The filters 423 can include one or more SAW resonators or packages in accordance with any suitable principles and advantages discussed herein. The wireless communication device 420 can be any suitable wireless communication device. For instance, a wireless communication device 420 can be a mobile phone, such as a smart phone. As illustrated, the wireless communication device 420 includes an antenna 421, an RF front end 422, a transceiver 424, a processor 425, a memory 426, and a user interface 427. The antenna 421 can transmit/receive RF signals provided by the RF front end 422. Such RF signals can include carrier aggregation signals. Although not illustrated, the wireless communication device 420 can include a microphone and a speaker in certain applications.

The RF front end 422 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 422 can transmit and receive RF signals associated with any suitable communication standards. The filters 423 can include SAW resonators of a SAW component or package that includes any suitable combination of features discussed with reference to any embodiments discussed above.

The transceiver 424 can provide RF signals to the RF front end 422 for amplification and/or other processing. The transceiver 424 can also process an RF signal provided by a low noise amplifier of the RF front end 422. The transceiver 424 is in communication with the processor 425. The processor 425 can be a baseband processor. The processor 425 can provide any suitable base band processing functions for the wireless communication device 420. The memory 426 can be accessed by the processor 425. The memory 426 can store any suitable data for the wireless communication device 420. The user interface 427 can be any suitable user interface, such as a display with touch screen capabilities.

Figure 8B:
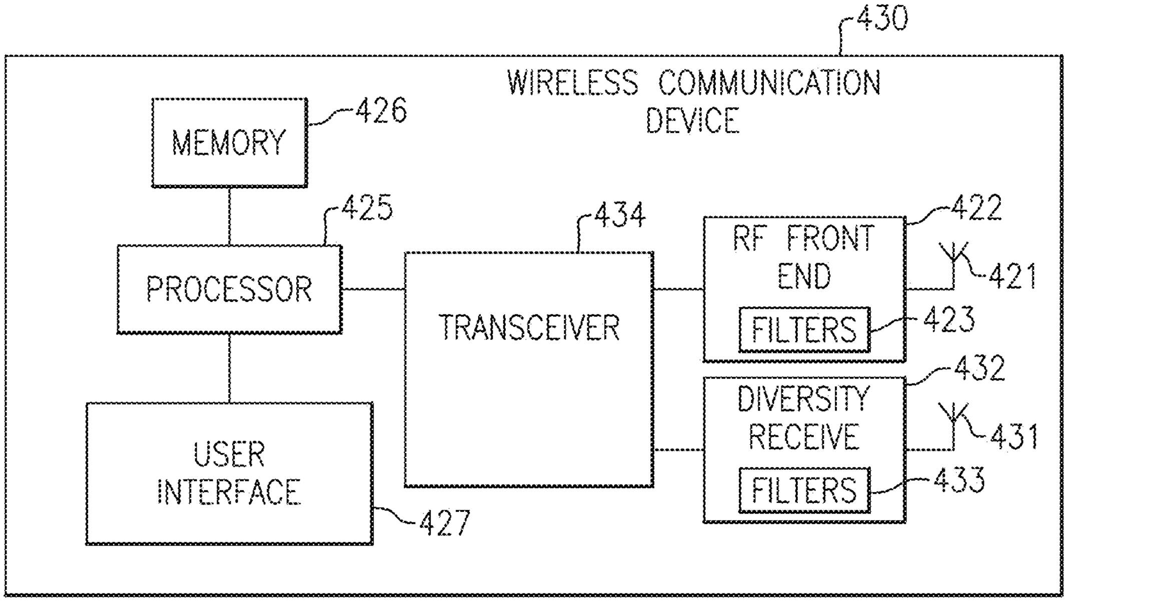
FIG. 8B is a schematic block diagram of another wireless communication device that includes a filter with a surface acoustic wave resonator in accordance with one or more embodiments.

FIG. 8B is a schematic diagram of a wireless communication device 430 that includes filters 423 in a radio frequency front end 422 and a second filter 433 in a diversity receive module 432. The wireless communication device 430 is like the wireless communication device 420 of FIG. 8A, except that the wireless communication device 430 also includes diversity receive features. As illustrated in FIG. 8B, the wireless communication device 430 includes a diversity antenna 431, a diversity module 432 configured to process signals received by the diversity antenna 431 and including filters 433, and a transceiver 434 in communication with both the radio frequency front end 422 and the diversity receive module 432. The filters 433 can include one or more SAW resonators or packaged acoustic wave components that include any suitable combination of features discussed with reference to any embodiments discussed above.

APPLICATIONS

Although embodiments disclosed herein relate to surface acoustic wave resonators or packages and packaged acoustic wave components, any suitable principles and advantages disclosed herein can be applied to other types of acoustic wave resonators that include an IDT electrode, such as Lamb wave resonators and/or boundary wave resonators. For example, any suitable combination of features of the tilted and rotated IDT electrodes disclosed herein can be applied to a Lamb wave resonator and/or a boundary wave resonator.

Some of the embodiments described above have provided examples in connection with wireless devices or mobile phones. However, the principles and advantages of the embodiments can be used for any other systems or apparatus that have needs for acoustic wave filters.

Such acoustic wave filters can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Language of degree used herein, such as the terms "approximately," "about," "generally," and "substantially"

as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A packaged acoustic wave component comprising:
- a wafer level packaging structure having a shield structure base and including a polymeric body having a conductive via passing through the polymeric body;
- a multi-layer piezoelectric substrate including a piezoelectric layer and a support substrate, a difference between a coefficient of thermal expansion of the shield structure base and a coefficient of thermal expansion of the support substrate being 13 ppm/deg or less; and
- an interdigital transducer electrode in electrical communication with the piezoelectric layer.

2. The packaged acoustic wave component of claim 1 wherein the difference between the coefficient of thermal expansion of the shield structure base and the coefficient of thermal expansion of the support substrate is 10 ppm/deg or less.

3. The packaged acoustic wave component of claim 1 wherein the difference between the coefficient of thermal expansion of the shield structure base and the coefficient of thermal expansion of the support substrate is 4 ppm/deg or less.

4. The packaged acoustic wave component of claim 1 wherein the coefficient of thermal expansion of support substrate has a value from around 3.5 ppm/deg to around 24 ppm/deg.

5. The packaged acoustic wave component of claim 1 wherein the coefficient of thermal expansion of the support substrate has a value from around 4 ppm/deg to around 20 ppm/deg.

6. The packaged acoustic wave component of claim 1 wherein the support substrate includes sapphire.

7. The packaged acoustic wave component of claim 1 wherein the piezoelectric layer includes lithium tantalate.

8. The packaged acoustic wave component of claim 1 wherein the piezoelectric layer includes lithium niobate.

9. The packaged acoustic wave component of claim 1 wherein the support substrate includes glass.

10. The packaged acoustic wave component of claim 1 wherein the support substrate includes spinel.

11. The packaged acoustic wave component of claim 1 wherein the support substrate includes quartz.

12. The packaged acoustic wave component of claim 1 wherein the wafer level packaging structure further includes a pillar between the multi-layer piezoelectric substrate and at least a portion of the shield structure base.

13. The packaged acoustic wave component of claim 1 wherein the coefficient of thermal expansion of the shield structure base has a value around 16.5 ppm/deg.

14. The packaged acoustic wave component of claim 1 wherein the shield structure base includes copper.

15. A packaged acoustic wave component comprising:
- a wafer level packaging structure having a shield structure base;
- a multi-layer piezoelectric substrate including a piezoelectric layer and a support substrate, a difference between a coefficient of thermal expansion of the shield structure base and a coefficient of thermal expansion of the support substrate being 13 ppm/deg or less, and the coefficient of thermal expansion of the shield structure base having a value around 16.5 ppm/deg; and
- an interdigital transducer electrode in electrical communication with the piezoelectric layer.

16. The packaged acoustic wave component of claim 15 wherein the wafer level packaging structure comprises a polymeric body having a conductive via passing through the polymeric body.

17. A packaged acoustic wave component comprising:
- a wafer level packaging structure having a shield structure base including copper;
- a multi-layer piezoelectric substrate including a piezoelectric layer and a support substrate, a difference between a coefficient of thermal expansion of the shield structure base and a coefficient of thermal expansion of the support substrate being 13 ppm/deg or less; and
- an interdigital transducer electrode in electrical communication with the piezoelectric layer.

18. A radio frequency module with a packaged acoustic wave component comprising:
- a wafer level packaging structure having a shield structure base and including a polymeric body having a conductive via passing through the polymeric body;
- a multi-layer piezoelectric substrate including a piezoelectric layer and a support substrate, a difference between a coefficient of thermal expansion of the shield structure base and a coefficient of thermal expansion of the support substrate being 13 ppm/deg or less; and
- an interdigital transducer electrode in electrical communication with the piezoelectric layer.

19. The radio frequency module of claim 18 wherein the radio frequency module is configured as a front end module.

20. The radio frequency module of claim 18 wherein the coefficient of thermal expansion of the shield structure base has a value around 16.5 ppm/deg.

* * * * *